United States Patent
Godeke et al.

(10) Patent No.: US 11,703,552 B2
(45) Date of Patent: Jul. 18, 2023

(54) MAGNETIC FIELD CONCENTRATING AND OR GUIDING DEVICES AND METHODS

(71) Applicant: Varian Medical Systems Particle Therapy GmbH., Troisdorf (DE)

(72) Inventors: Arno Godeke, Bonn (DE); Michael Schillo, Bonn (DE)

(73) Assignee: VARIAN MEDICAL SYSTEMS PARTICLE THERAPY GMBH & CO. KG, Troisdorf (DE)

( * ) Notice: Subject to any disclaimer, the term of this patent is extended or adjusted under 35 U.S.C. 154(b) by 0 days.

(21) Appl. No.: 17/684,308

(22) Filed: Mar. 1, 2022

(65) Prior Publication Data

US 2022/0187386 A1 Jun. 16, 2022

Related U.S. Application Data (63) Continuation of application No. 16/838,914, filed on Apr. 2, 2020, now Pat. No. 11,280,850.

(51) Int. Cl.
| | | |
|---|---|---|
| *G01R 33/20* | (2006.01) | |
| *G01R 33/00* | (2006.01) | |
| *G01R 33/035* | (2006.01) | |

(52) U.S. Cl.
CPC ........ *G01R 33/0011* (2013.01); *G01R 33/035* (2013.01); *G01R 33/20* (2013.01)

(58) Field of Classification Search
CPC ............. G01R 33/00; G01R 33/0035; G01R 33/0023; G01R 33/0017; G01R 31/3191; G01R 33/0011; G01R 33/035; G01R 33/20; G01B 7/004; G01C 17/38; G06F 3/017; G06F 3/0346; G06F 3/012
See application file for complete search history.

(56) References Cited

U.S. PATENT DOCUMENTS

| | | |
|---|---|---|
| 5,130,686 A | 7/1992 | Leupold |
| 5,442,294 A | 8/1995 | Rorden |
| 10,383,206 B1 * | 8/2019 | Nuttens ................ H05H 13/00 |
| | (Continued) | |

FOREIGN PATENT DOCUMENTS

WO  2017087541  5/2017

OTHER PUBLICATIONS

Qin et al. Comparison of Beam Optics for Normal-Conducting and Superconducting Gantry Beamline Applied to the Proton Therapy System. Institute of Applied Electromagnetic Engineering. Huazhong University of Science and Technology (HUST) CPO-10, Key West, FL, USA, Oct. 19, 2018.

(Continued)

*Primary Examiner* — Jermele M Hollington
*Assistant Examiner* — Taqi R Nasir
(74) *Attorney, Agent, or Firm* — Harness, Dickey & Pierce, P.L.C.

(57) ABSTRACT

A magnetic field concentrating or guiding device can include one or more coils, and one or more foil, tape and/or bulk superconductor structures disposed in one or more predetermined positions with relation to the coils. The one or more superconductor structures can form one or more magnetic field carrying regions. During operation, current passing through the one or more coils can generate one or more magnetic fields that are compressed or guided in the magnetic field carrying regions.

19 Claims, 9 Drawing Sheets

(56) References Cited

U.S. PATENT DOCUMENTS

| | | | |
|---|---|---|---|
| 11,280,850 | B2 | 3/2022 | Godeke et al. |
| 2003/0169142 | A1 | 9/2003 | Vicci |
| 2012/0126726 | A1* | 5/2012 | Antaya ................ H05H 13/005 |
| | | | 315/502 |
| 2013/0009571 | A1 | 1/2013 | Antaya |
| 2013/0249443 | A1 | 9/2013 | Antaya et al. |
| 2014/0055058 | A1 | 2/2014 | Johnstone |
| 2014/0087953 | A1* | 3/2014 | Bromberg ................ H01F 6/06 |
| | | | 315/502 |
| 2014/0296075 | A1 | 10/2014 | Jongen et al. |
| 2014/0371076 | A1 | 12/2014 | Jongen |
| 2016/0353562 | A1 | 12/2016 | Antaya |
| 2016/0381780 | A1 | 12/2016 | Subotic |
| 2017/0332475 | A1* | 11/2017 | Kleeven ................ H05H 7/001 |
| 2018/0116044 | A1 | 4/2018 | Radovinsky |
| 2018/0161598 | A1 | 6/2018 | Antaya |
| 2019/0013724 | A1 | 1/2019 | Senderos et al. |

OTHER PUBLICATIONS

Ewa Oponowicz. Gantry Design Using Superconducting Magnet. OMA Topical Workshop on Medical Accelerator Design and Diagnostics. The University of Manchester/The Cockcroft Institute, 22 pp. GSI, Germany Dec. 11-12, 2018.

Arno Godeke. Superconductors in Large Scale Applications: Materials, Production and Purposes. Applied Superconductivity Center, University of Wisconsin-Madison. 22 pp. Retrieved Jun. 30, 2020.

Ainslie et al Numerical Modeling of Bulk Superconductor Magnetisation. IOP Publishing, Bristol, UK. IOP Publishing Ltd. 2020. US Office: IOP Publishing, Inc. 190 North Independence Mall West, Suite 601, Philidelphia, PA 19106, USA. 12 pp. Retrieved Jun. 30, 2020.

Yves Jongen. An Introduction to Cyclotrons. PTCoG 47 Education session Jacksonville May 19, 2008 50 pp.

Ainslie et al. Numberical Modeling of Bulk Superconductor Magnetisation. Chapter 1 Fundamentals of Bulk Superconducting Materials. IOP Science, iopscience.iop.org. 21 pp. Retrieved Jun. 30, 2020.

Timothy A. Antaya. Cyclotron Basics. Unit 10-Lectures 14. MIT Plasma Science and Fusion Center MIT 8.277/6.808 Intro to Particle Accelerators. 50 pp Retrieved Jun. 30, 2020.

Timothy A. Antaya. Advanced Cyclotron and Synchrocyclotron Designs. MIT 8.277/6.808 Intro to Particle Accelerators 38 pp, Retrieved Jun. 30, 2020.

Kleeven et al. Cyclotrons: Magnetic Design and Beam Dynamics. arXiv: 1804.0896v1 [physics.med-ph] Apr. 24, 2018. 62 pp.

Paul Heikkinen. Cyclotrons. University of Jyvaskyla, Accelator Laboratory, Jyvaskyla, Finland. 14 pp.

M.K. Craddock. AG Focusing in the Thomas Cyclortron of 1938. University of British Columbia and TRIUMF. Proceedings of PAC09, Vancouver, BC, Canada FR5REP113. 3 pp.

Hezel et al. The Influence of a Superconducting Split-pair Solenoid as an Insertion Device on the Performance of a storage Ring for Synchrontron Radiation. Project Mikrosystemtechnik. Forschungszentrum Karlsruhe Technik und Umwelt Wissenschaftliche Berichte FZKA Oktober 50 pp.

Takashi et al. A New Concept of a Hybrid Trapped Field Magnet Lens. Superconductor Science and Technology. OP Publishing Supercond. Sci. Technol. 3' (2018).

Ainslie et al. Numerical Modeling of bulk Superconductor Magnetisation. Chapter 1 Fundamentals of Bulk Superconducting Materials. doi:10.1088/978.

Takayama, et al. Manfuacturing of LTS and HTS Magnets for Heavy-Ion Rotating Gantry. Template version 8.0, 2.7 Jul. 2017.

Durrell et al. Bulk Superconductors: A Roadmap to Applications. IOP Publishing. Supercond. Sci. Techno.31 (2018) 103501 (17 pp) Superconductor Science and Technology.

Wikipedia https://en.wikipedia.org/wiki/Meissner_effect 5 pp. Retrieved on Jun. 30, 2020.

Unknown Author. Applied Cyclortrons: Beam Dynamics and Magnetic Design. Retrieved on Jun. 30, 2020.

Wikipedia. Solenoid. Retrieved from http://en.wikipedia.org/w/index.php?title=Solenoid&oldid=939712031* on Jun. 30, 2020.

Wikipedia. Superconductivity. Retrieved from https://en.wikipedia.org/w/index.php?title=Solenoid&oldid=939712031* on Jun. 30, 2020.

Unknown Author. modtech@theory.uwinnipeg.ca. Superconductors. Dated Sep. 29, 1999.

* cited by examiner

MAGNETIC FIELD CONCENTRATING AND OR GUIDING DEVICES AND METHODS

CROSS-REFERENCE TO RELATED APPLICATIONS

This is a continuation of U.S. patent application Ser. No. 16/838,914 filed Apr. 2, 2020, which is incorporated herein in its entirety.

BACKGROUND OF THE INVENTION

Magnetic fields are utilized in a number of applications that can include, but are not limited to radiotherapy, radio-surgery, proton therapy, nuclear magnetic resonance (NMR), magnetic resonance imaging (MRI), accelerator magnets for high energy physics (HEP) research, and nuclear fusion. For example, magnetic fields can be utilized to direct and/or focus charged particles. A number of applications utilize relatively large magnetic flux densities. However, increasing the magnetic flux density of electro-magnets typically results in increases in the size of the magnets, in the amount of material utilized in the magnets, in the weight of the magnets, in the current requirements, in the cooling requirements of the magnets, in the complexity of manufacture and/or the like. Therefore, there is a continuing need for improved devices and techniques for generating large magnetic flux densities.

SUMMARY OF THE INVENTION

The present technology may best be understood by referring to the following description and accompanying drawings that are used to illustrate embodiments of the present technology directed toward magnetic field concentrating and/or guiding devices and methods.

In one embodiment, a magnetic field concentrating or guiding device can include one or more coils and one or more superconductor structures. The one or more coils can be configured to generate one or more magnetic fields. The one or more superconductor structures can be disposed in one or more predetermined positions with relation to the one or more coils. The one or more superconductor structures can be shaped to concentrate or guide the one or more magnetic fields generated by the one or more coils.

In another embodiment, a magnetic field concentrating or guiding method can include providing a coil and providing a superconductor having a channel disposed in a predetermined orientation to the coil.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and/or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and/or" includes any and all combinations of one or more of the associated elements. It is also to be understood that the phraseology and terminology used herein is for the purpose of description and should not be regarded as limiting.

Embodiments of the present technology provide devices for concentrating and/or guiding magnetic fields. The devices can include one or more conductive coils and one or more superconductor structures disposed in predetermined positions with relation to the one or more conductive coils. The one or more conductive coils can be configured to generate one or more magnetic fields. The one or more superconductor structures can be configured to concentrate the one or more magnetic fields. Aspects of the present technology will be further explained with reference to the following exemplary implementations. However, aspects of the present technology are not limited to the following exemplary implementation. Instead, aspects of the present technology can be applied to numerous other implementations.

Figure 1A:
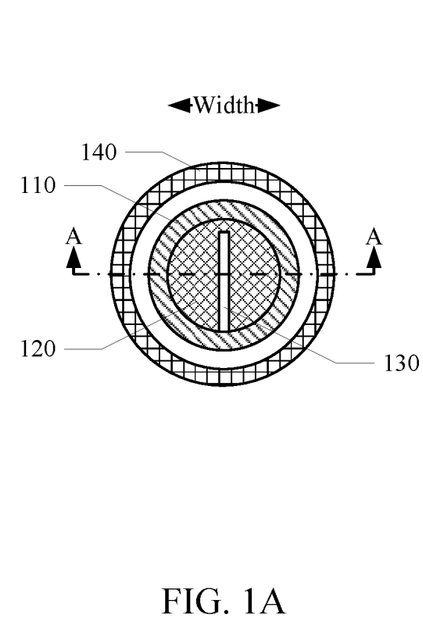
FIGS. 1A and 1B show an exemplary device for concentrating a magnetic field, in accordance with one implementation of the present technology.
Figure 1B:
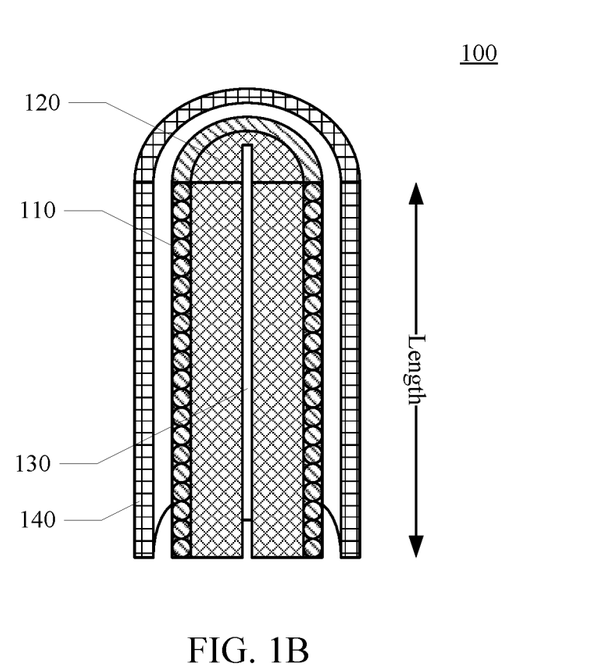

Referring now to FIGS. 1A and 1B, an exemplary device for concentrating a magnetic field, in accordance with one implementation of the present technology, is shown. An end view of the device is illustrated in FIG. 1A, and a cutaway, along section line A-A, side view of the device is illustrated in FIG. 1B. The device 100 can include a conductive coil 110 and one or more superconductor structures 120 disposed within the conductive coil 110. As used herein a coil refers to one or more current carrying elements arranged in one or more rotations about a volume that is configured to generate a magnetic field. The current carrying element can be arranged in any geometry, including but not limited to a single helix winding, a plurality of concentric helix windings, one or more canted helix windings, or one or more cosine-theta windings. The conductive coil 110 can for example be a solenoid. The conductive coil 110 can be a metal conductor, herein referred to as a resistive conductor, or a non-resistive conductor, herein referred to as a superconductor, disposed in a path around a length of a volume. Although the conductive coil 110 is illustrated as a cylinder, the conductive coil 110 can have any form factor, such as but not limited to cube, parallelepiped, pentagonal prism, hexagon prism, including curved versions of such shapes and other similar volumetric shapes. Similarly, the conductor of the conductive coil 110 can have any cross-sectional form factor, such as but not limited to round, oblong, square or rectangular In one implementation, the one or more superconductor structures 120 can comprise one or more foil or tape superconductor structures. In another implementation, the one or more superconductor structures 120 can comprise one or more bulk superconductor structures. The one or more superconductor structures 120 can be formed from a medium-temperature superconductor material or high-temperature superconductor material. The high-temperature superconductor material can include, but is not limited to, rare-earth barium copper oxides (REBCO) such as yttrium barium copper oxide (YBCO), or gadolinium barium copper oxide (GdBCO), or europium barium copper oxide (EUBCO), lanthanum barium copper oxide (LBCO), and different types of bismuth strontium calcium copper oxide (BSCCO). The medium-temperature superconductor material can include, but is not limited to, magnesium diboride ($MgB_2$), or iron (Fe) based superconductors, also referred to as Pnictides. As used herein the term bulk superconductor material refers to superconductor materials, as opposed to structures that comprise a combination of superconductor material in combination with a resistive conductor such as copper, silver or the like which are also commonly referred to as superconductors and which typically are manufactured in the form of elongated strips, tapes or wires. The foil or tape superconductor structures as used herein are commonly referred to as coated conductors in which the superconductor layer is applied to a substrate made of e.g. Hastelloy, stainless steel and similar alloys or nickel alloys, e.g. with tungsten (e.g. Ni-W5 with 5% tungsten). As used herein high-temperature superconductor material refers to materials that exhibit superconductivity above about 40 Kelvin (K). As used herein medium-temperature superconductor material refers to materials that exhibit superconductivity above about 25 Kelvin (K). In one implementation, the one or more superconductor structures 120 can include a type-I superconductor. The type-I superconductor can substantially exclude magnetic fields from passing through the superconductor structures 120. In another implementation, the one or more superconductor structures 120 can include a type-II superconductor. The type-II superconductor in a mixed state can allow a portion of a magnetic field to pass through the superconductor structures 120, while the rest of the magnetic field is excluded from passing through the superconductor structures 120.

The one or more foil or tape superconductor structures can comprise a continuous superconducting path in the foil or tape plane. For example, a stack of REBCO foils or tapes can be used instead of, or in combination with, bulk superconducting material to similarly partially or completely expel the magnetic flux, thereby concentrating the magnetic flux in an area where the superconducting foils or tapes are not present. In one implementation, the foil or tape superconductor can have a continuous path in a plane perpendicular to the magnetic flux.

Figure 2A:
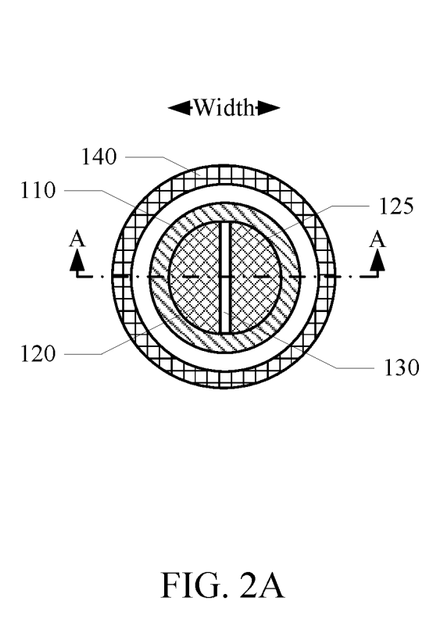
FIGS. 2A and 2B show an exemplary device for concentrating a magnetic field, in accordance with another implementation of the present technology.
Figure 2B:
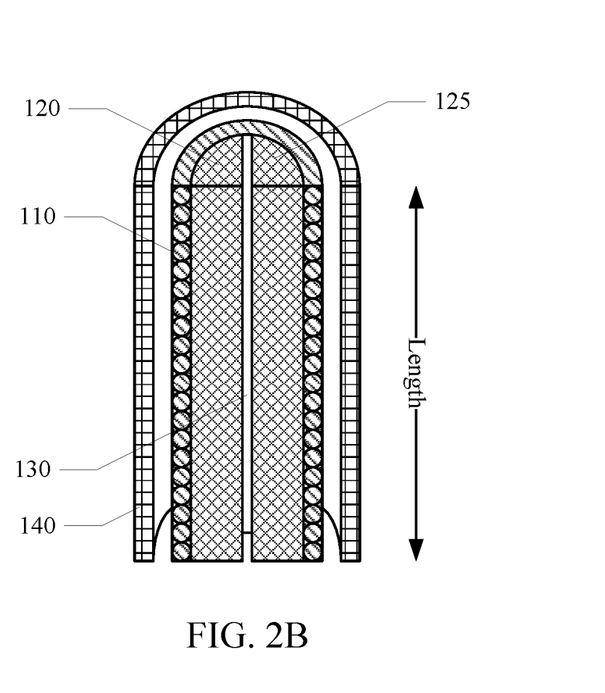

The shape of the one or more superconductor structures 120 can, for example, form one or more channels 130 disposed lengthwise through the one or more superconductor structures 120. The one or more channels 130 can have any form factor. The one or more channels 130 can for example extend to at least one side of the coil 110, as illustrated in FIGS. 1A and 1B. In another example, the one or more channels can also extend out through the foil, tape and/or bulk superconducting material in one or more widthwise directions and the entire length of the coil 110, as illustrated in FIGS. 2A and 2B, or one or more portions of the length.

The device 100 can optionally include one or more magnetic shields 140 disposed in one or more predetermined positions with relation to the coil 110. The one or more magnetic shield structures 140, for example, can comprise a foil, tape and/or bulk superconductor structure. The one or more magnetic shield structures 140 of superconductor can be configured to reduce, or even fully remove, undesirable stray magnetic fields around the device 100. The one or more magnetic shield structures 140, for example, can be disposed about the outside of the coil, as illustrated in FIGS. 1A and 1B. Although the magnetic shield structure 140 is illustrated as a cylinder surrounding the outside length of the coil 110, the magnetic shield structure 140 can have any form factor.

Figure 3:
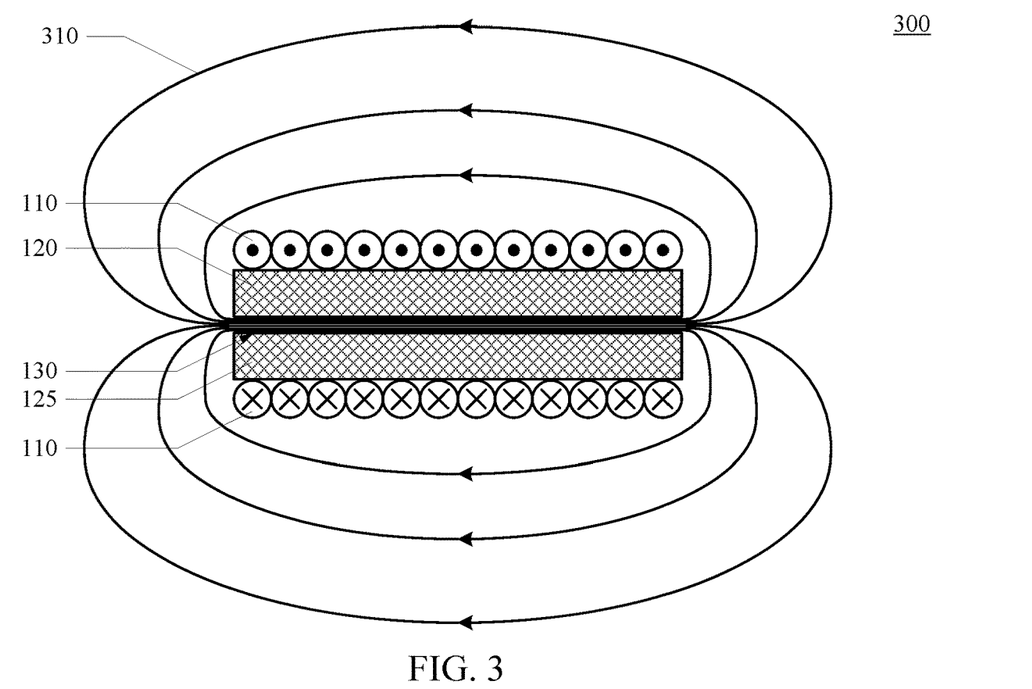
FIG. 3 shows an exemplary device for concentrating a magnetic field, in accordance with another implementation of the present technology.

During operation of the device 100 the one or more superconductor structures 120, 125 are maintained at or below the critical temperature of the superconductor material. For example, one or more coolers (not shown) can be coupled to the one or more superconductor structures 120, 125. The one or more coolers can be configured to cool the one or more superconductor structures 120, 125 below the critical temperature of the superconductor material before the coil 110 generates one or more magnetic fields. The one or more coolers can then maintain the one or more superconductor structures 120, 125 below the critical temperature while the coil 110 generates one or more magnetic fields. The one or more coolers can include one or more cryocoolers, cryogen-baths or the like, thermally coupled to the one or more superconductor structures 120, 125. During operation of the device 100, a current flows through the coil 110 generating the one or more magnetic fields. The shape of the one or more superconductor structures 120, 125 is configured to concentrate the magnetic fields generated by the coil 110. The magnetic field generated by the coil 110 does not pass, or passes only partially through the one or more superconductor structure 120, 125 when operating at or below the critical temperature. Instead, the magnetic field 310 generated by the coil 110 is concentrated by the one or more superconductor structures 120, 125 in the one or more channels 130 disposed through the one or more superconductor structures 120, 125, as illustrated in FIG. 3.

Figure 4:
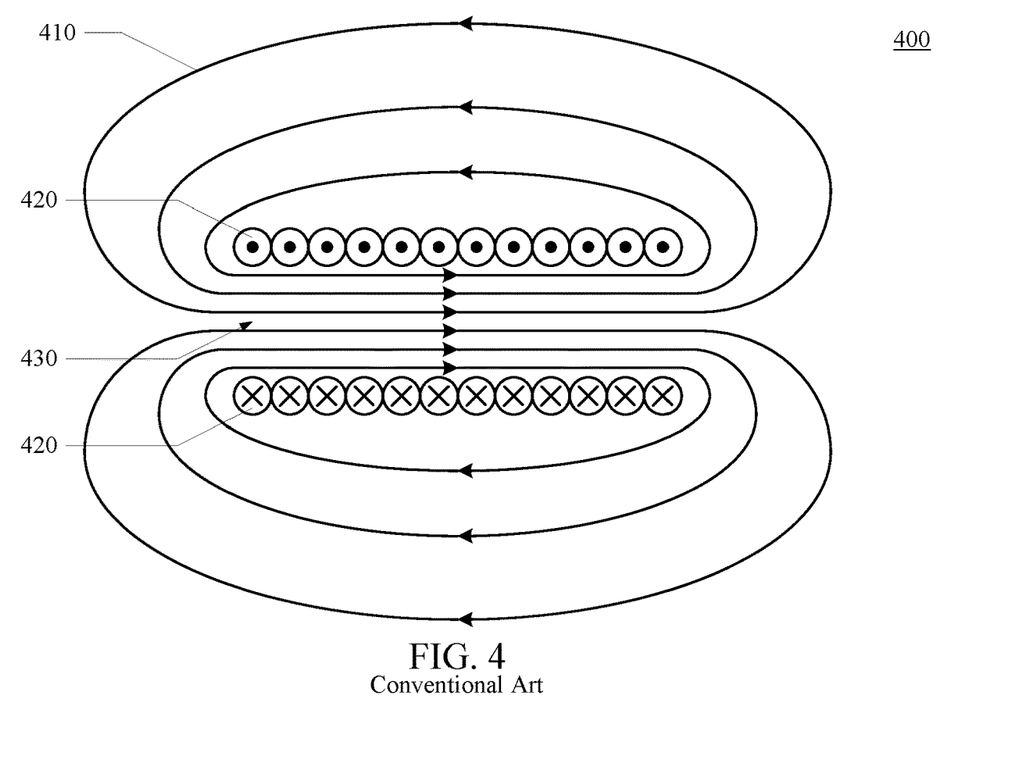
FIG. 4 shows a device for generating a magnetic field according to the conventional art.

In comparison, FIG. 4 illustrates the magnetic field 410 generated by a coil 420 in accordance with the conventional art. When a current flows through the coil 420, illustrated as going into the page in the upper conductors and coming out of the page in the lower conductors, a magnetic field 410 is generated with a flux from left to right through the center 430 of the coil 420 and wrapping around the outside of the coil 420. The magnetic field 410 is distributed throughout the center 420 of the coil 420.

Referring again to FIG. 3, the same magnetic field generated by the coil 110 is concentrated by the one or more superconductor structures 120, 125 into the smaller area of the one or more channels 130 through the superconductor structures 120, 125. Therefore, the magnetic flux density can advantageously be increased in a given area by the one or more superconductor structures 120, 125 concentrating the magnetic field in the one or more channels 130 disposed through the one or more superconductor structures 120, 125 for the same amount of current flowing through the same coils 110, 420. For example, a 2-3 Tesla (T) magnetic field 410 generated by a coil 420 can be concentrated by a superconductor structure 120, 125 to achieve a 7 T magnetic field in a channel 130 disposed through the superconductor structures 120, 125 within the coil 110.

Figure 5:
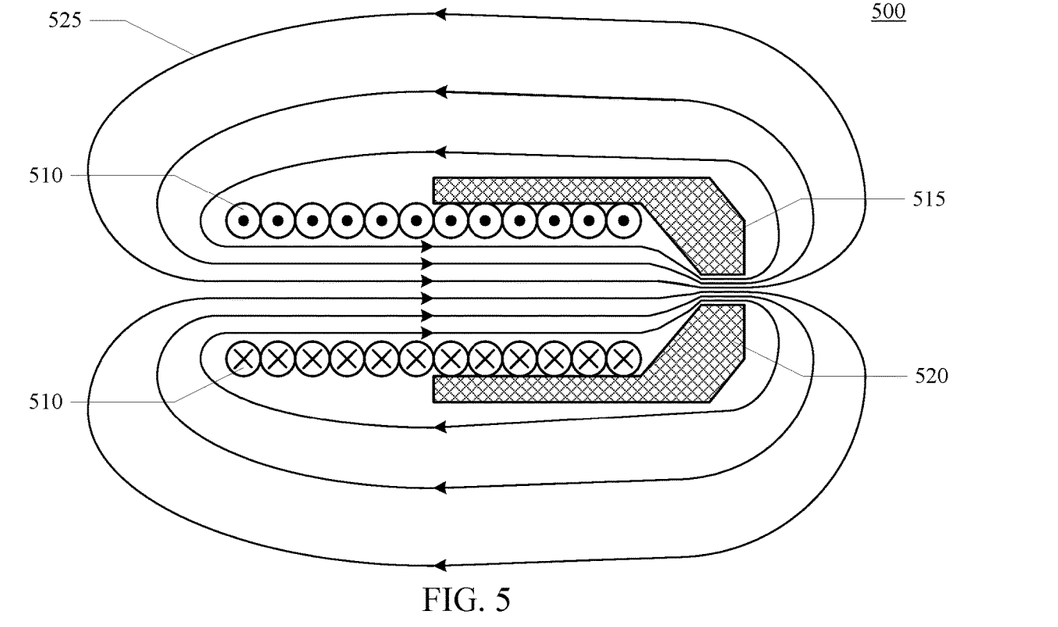
FIG. 5 shows an exemplary device for concentrating a magnetic field, in accordance with another implementation of the present technology.

Referring now to FIG. 5, an exemplary device for concentrating a magnetic field, in accordance with another implementation of the present technology, is shown. The device 500 can include a conductive coil 510 and one or more superconductor structures 515, 520 disposed outside the conductive coil 510. In other implementations, the one or more superconductor structures 515, 520 can be disposed in any orientation with respect to the coil 510 to condense, guide or the like the magnetic field 525.

Figure 6:
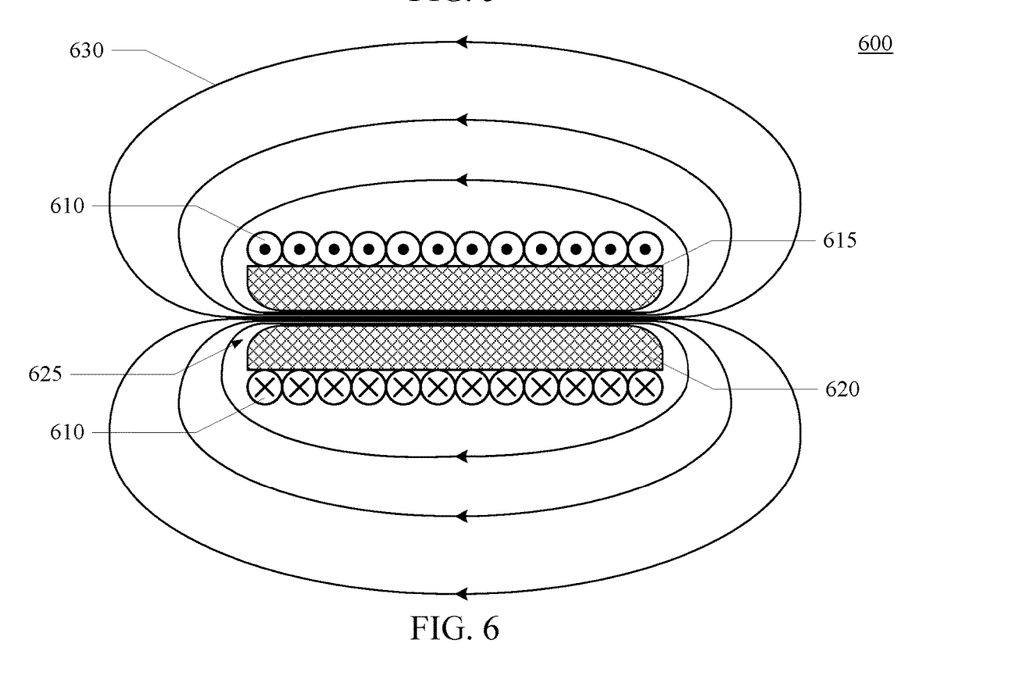
FIG. 6 shows an exemplary device for concentrating a magnetic field, in accordance with another implementation of the present technology.

Referring now to FIG. 6, an exemplary device for concentrating a magnetic field, in accordance with another implementation of the present technology. Again, the device 600 can include a conductive coil 610 and one or more superconductor structures 615, 620 disposed within the conductive coil 610. The one or more superconductor structures 615, 620 can further include one or more tapers 625 to further condense, guide or the like the magnetic field 630. For example, the superconductor structures 615, 620 can further include wider entry and exits at the ends of the conductive coil 610. Furthermore, the superconductor structures 615, 620 disposed in any orientation with respect to the coil can include any form factor of tapers to condense, guide or the like the magnetic field.

In other implementations, the devices 100, 200, 300, 500, 600 can further combine superconducting flux guidance with magnetic flux guidance. For example, magnetic materials, including but not limited to paramagnetic, ferromagnetic, holmium and the like materials can be utilized in combination with the superconductor structures. The additional magnetic materials can be disposed as liners in the one or more channels along the superconductor structures, outside the superconductor structures proximate the entry and/or exit to the one or more channels, and/or the like. The additional magnetic materials can for example be utilized to improve or modify the magnetic flux distribution in the one or more channels, the discontinuity in the magnetic field at the entry and/or exit to the one or more channels, and/or the like.

Implementations of aspects of the present technology can also include devices for concentrating, guiding or the like higher order magnetic fields. For example, a plurality of coils can be employed to generate higher order magnetic fields, and one or more foil, tape and/or bulk superconductor structures disposed in predetermined positions relative to the solenoids can concentrate the higher order magnetic fields. The higher order magnetic fields can include quadrupole, sextupole, octupole and higher.

Figure 7:
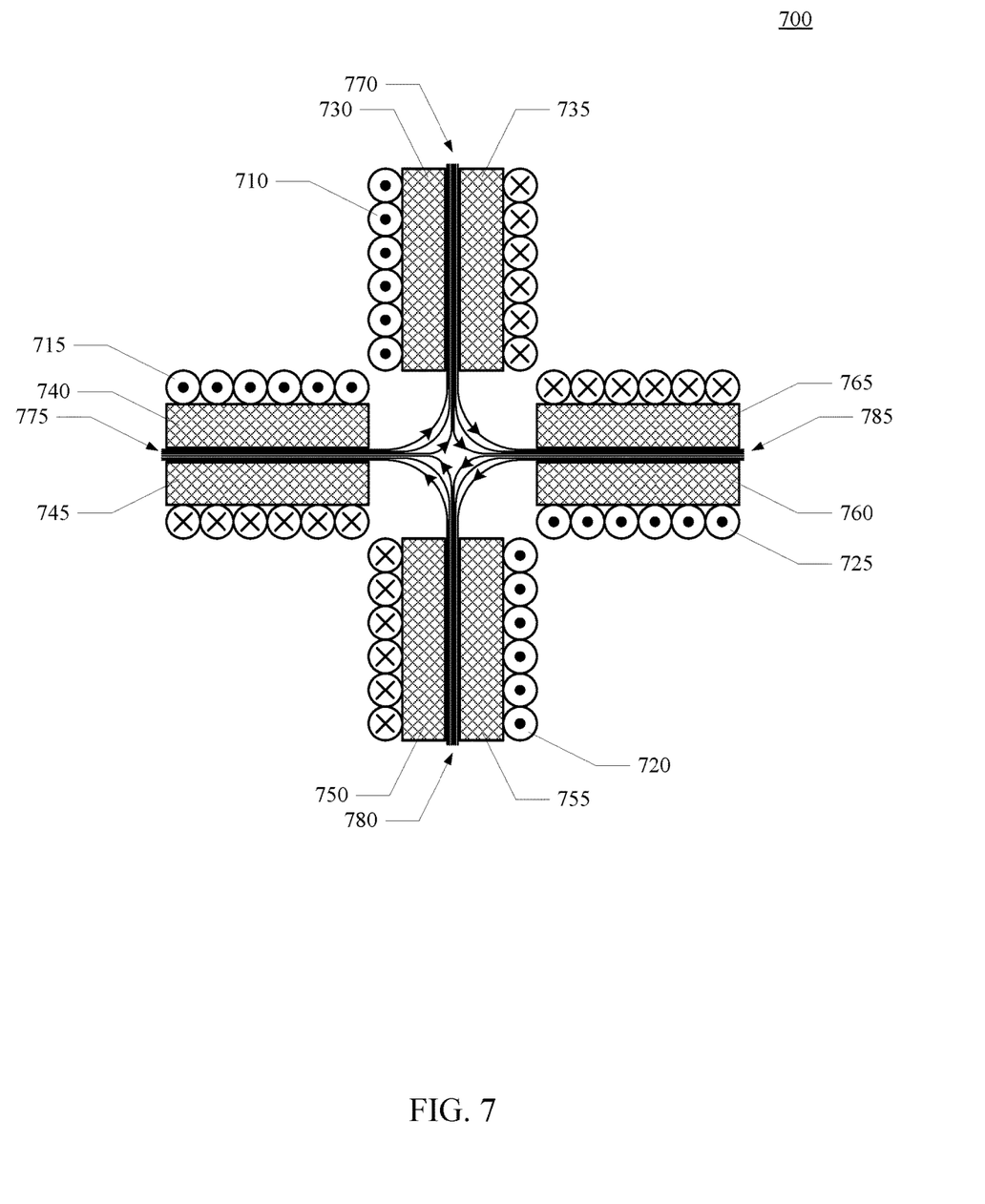
FIG. 7 shows an exemplary device for concentrating a higher order magnetic field, in accordance with another implementation of the present technology.

Referring now to FIG. 7, an exemplary device for concentrating a higher order magnetic field, in accordance with another implementation of the present technology, is shown. FIG. 7 illustrates a cross section view of an exemplary quadrupole device 700 including four conductive coils 710-725. One or more foil, tape and/or bulk superconductor structures 730-765 can be disposed within each of the conductive coils 710-725. Again, the conductive coils 710-725 can be a resistive conductor or a superconductor disposed in a helix path around a length of a volume. The conductive coils 710-725 can have any form factor. Again, the one or more foil, tape and/or bulk superconductor structures 730-765 can be formed from a medium-temperature superconductor material or high-temperature superconductor material.

Figure 8:
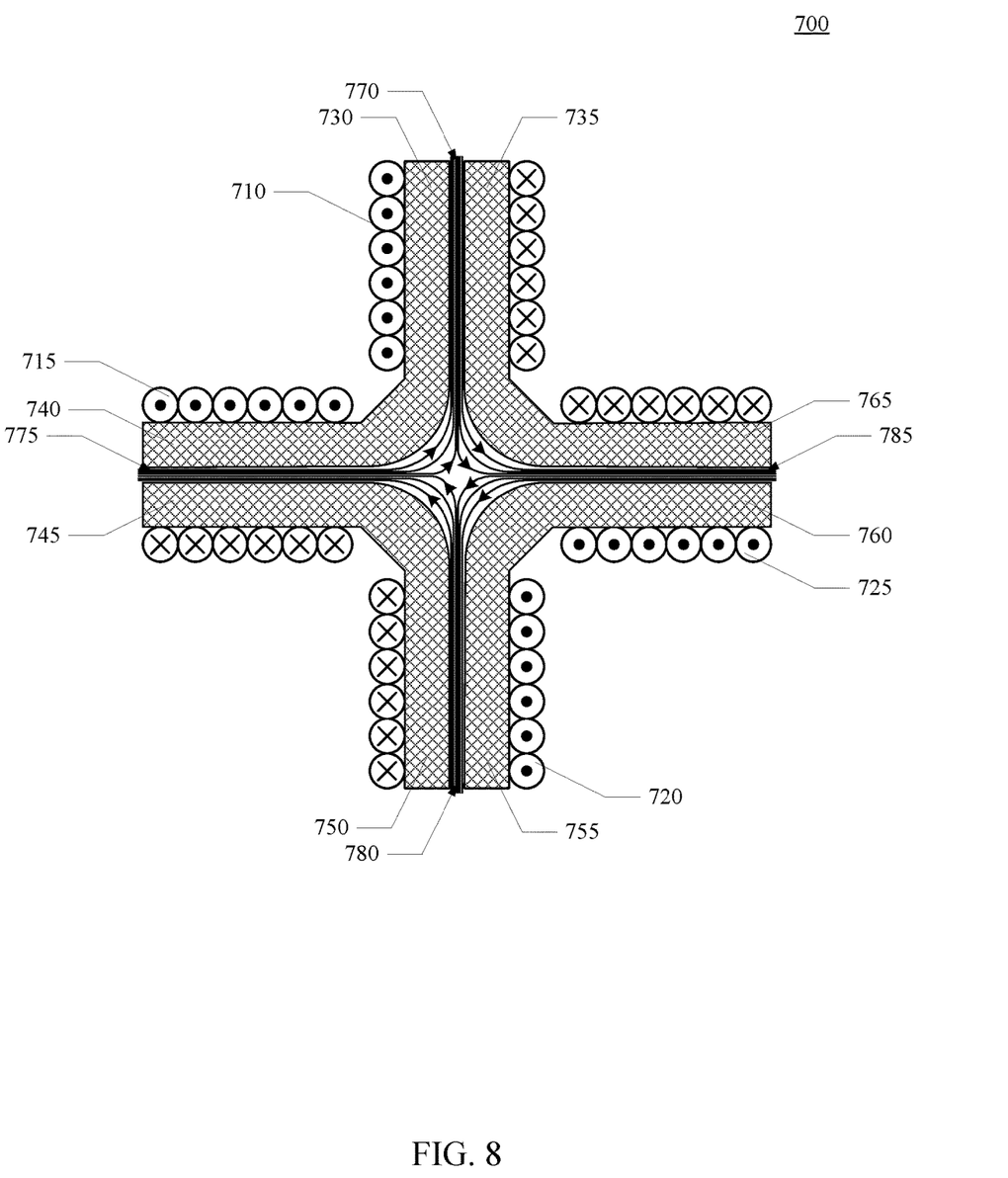
FIG. 8 shows an exemplary device for concentrating a higher order magnetic field, in accordance with another implementation of the present technology.

Again, the shape of the one or more foil, tape and/or bulk superconductor structures 730-765 can for example form one or more channels 770-785 disposed lengthwise through the one or more superconductor structures 730-765. The one or more channels 770-785 can have any form factor. Again, the one or more foil, tape and/or bulk superconductor structures 730-765 can be disposed within each coil 710-725 as illustrated in FIG. 7, can be disposed outside the coils (not shown), or can be disposed inside and outside the coils as illustrated in FIG. 8, to condense, guide or the like the one or more magnetic fields.

Again, the device 700 can also optionally include one or more magnetic shields (not shown) disposed in one or more predetermined positions with relation to the coils 710-725. The one or more magnetic shield structures, for example, can comprise a foil, tape and/or bulk superconductor shields.

Figure 9:
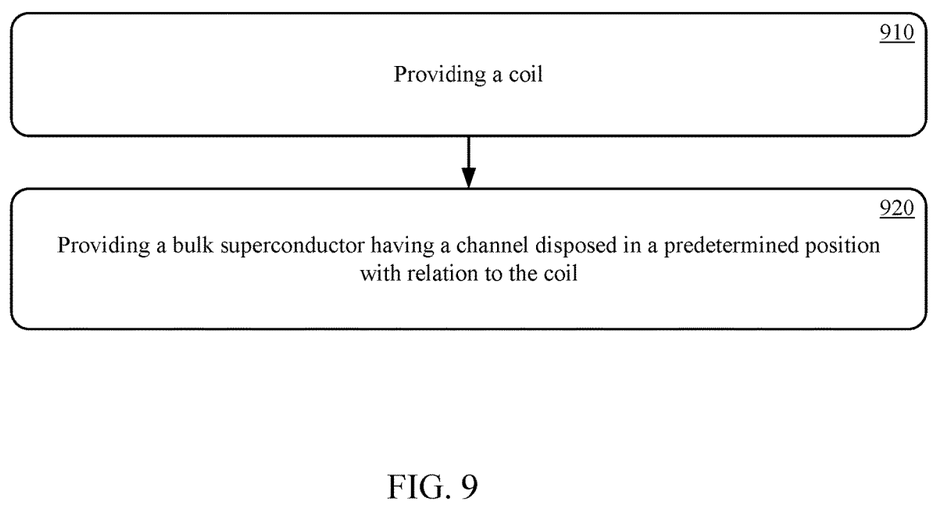
FIG. 9 shows a magnetic field concentration method, in accordance with another implementation of the present technology.

Referring now to FIG. 9, a magnetic field concentration method, in accordance with another implementation of the present technology, is shown. The method can include providing a coil, at 910. The coil can be a resistive conductor or a superconductor coil disposed in a helix path around a length of a volume. Alternatively, the coil can be resistive conductor or a superconductor coil disposed in a double-helix, double racetrack, cosine theta, canted cosine-theta or the like. Providing the coil can further include providing a current passing through the resistive or superconducting coil. If the coil is comprised of a superconductor, providing the coil can also further include cooling superconductor coil below the critical temperature of the superconductor coil.

At 920, a foil, tape and/or bulk superconductor can be provided in one or more predetermined positions with relation to the coil. The foil, tape and/or bulk superconductor can be a medium-temperature or high-temperature superconductor. Providing the foil, tape and/or bulk superconductor can further include providing one or more foil tape and/or bulk superconductor structures disposed in one or more predetermined positions with relation to the coil and shaped to concentrate the one or more magnetic fields. In one implementation, the foil, tape and/or bulk superconductor can include a type-I superconductor. The type-I superconductor can substantially exclude magnetic fields from passing through the superconductor such that the magnetic field is concentrated or guided through one or more channels formed by the one or more foil, tape and/or bulk superconductor structures. In another implementation, the foil, tape and/or bulk superconductor can include a type-II superconductor. The type-II superconductor in a mixed state can allow a portion of a magnetic field to pass through the superconductor structures, while the rest of the magnetic field is concentrated or guided through one or more channel formed by the one or more foil, tape and/or bulk superconductor structures. Providing the foil, tape and/or bulk superconductor can also further include cooling the foil, tape and/or bulk superconductor below the critical temperature of the superconductor material. In one implementation, the foil, tape and/or bulk superconductor can be cooled below the critical temperature of the superconductor material before the coil generates one or more magnetic fields. The foil, tape and/or bulk superconductor can then be maintained below the critical temperature while the coil generates one or more magnetic fields.

The magnetic field concentration method can be further extended to providing a plurality of coils and providing one or more foil, tape and/or bulk superconductor structures disposed in one or more predetermined positions with relation to the coils.

Figure 10:
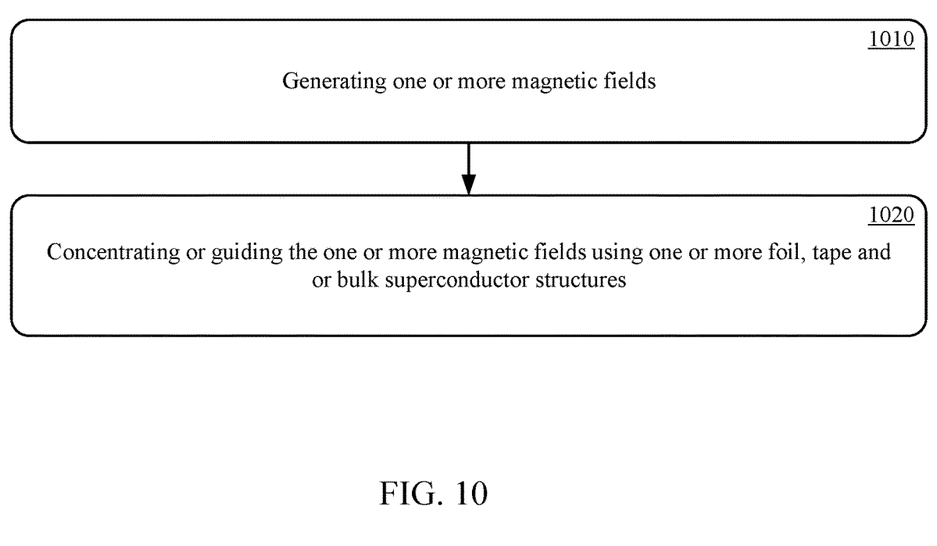
FIG. 10 shows a method of shaping one or more magnetic fields, in accordance with another implementation of the present technology.

Referring now to FIG. 10, a method of shaping one or more magnetic fields, in accordance with another implementation of the present technology, is shown. The method can include generating one or more magnetic fields, at 1010. Generating the one or more magnetic fields can include passing a current in a helix, double-helix, double racetrack, cosine theta, canted cosine-theta or the like path. Passing the current around the given path can comprise passing a current through a resistive or superconducting coil of a given volume and length.

At 1020, the one or more magnetic fields can be concentrated or guided using one or more foil, tape and/or bulk superconductor structures. The one or more foil, tape and/or bulk superconductor structures can be disposed in one or more predetermined positions with relation to the one or more magnetic fields to concentrate or guide the one or more magnetic fields. For example, the one or more foil, tape and/or bulk superconductor structures can be disposed in one or more predetermined positions with relation to the coil to concentrate or guide the one or more magnetic fields through a contiguous portion of a volume that extends through the one or more foil, tape and/or bulk superconductor structures. Confining or shaping the one or more magnetic fields can further include providing one or more magnetic shields disposed in one or more other predetermined positions with relation to the coil.

The magnetic field concentrating and/or guiding devices and methods in accordance with aspects of the present technology can advantageously be utilized in radiation therapy devices such as, but not limited to, radiotherapy, radiosurgery, and proton therapy. The magnetic field concentrating and/or guiding devices and methods can also advantageously be utilized in nuclear magnetic resonance (NMR), magnetic resonance imaging (MRI), accelerator magnets for high energy physics (HEP) research, and nuclear fusion. For example, the devices for concentrating one or more magnetic fields can be utilized for bending magnets, focusing magnets and the like.

Figure 11A:
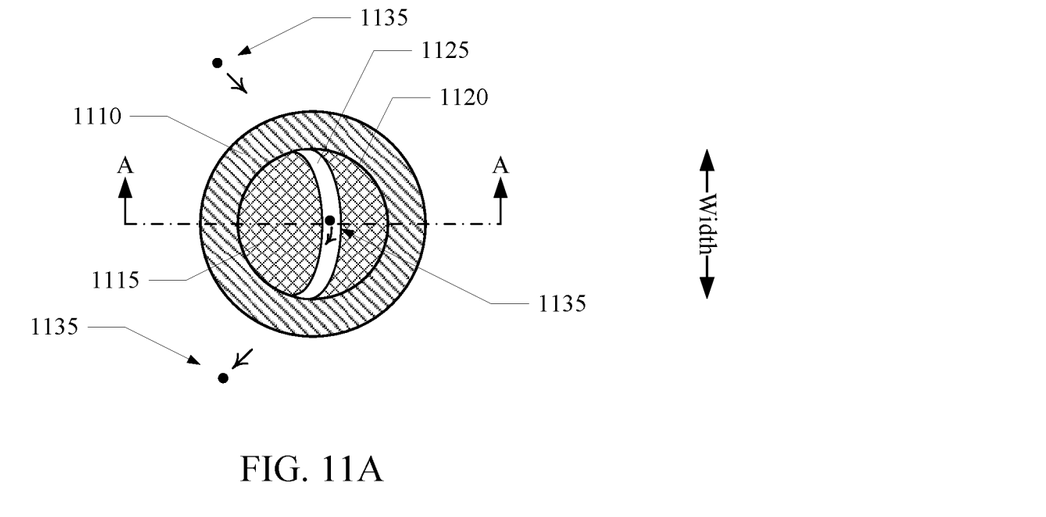
FIGS. 11A and 11B show an exemplary device for applying a concentrated magnetic field to a charged particle, in accordance with another implementation of the present technology.
Figure 11B:
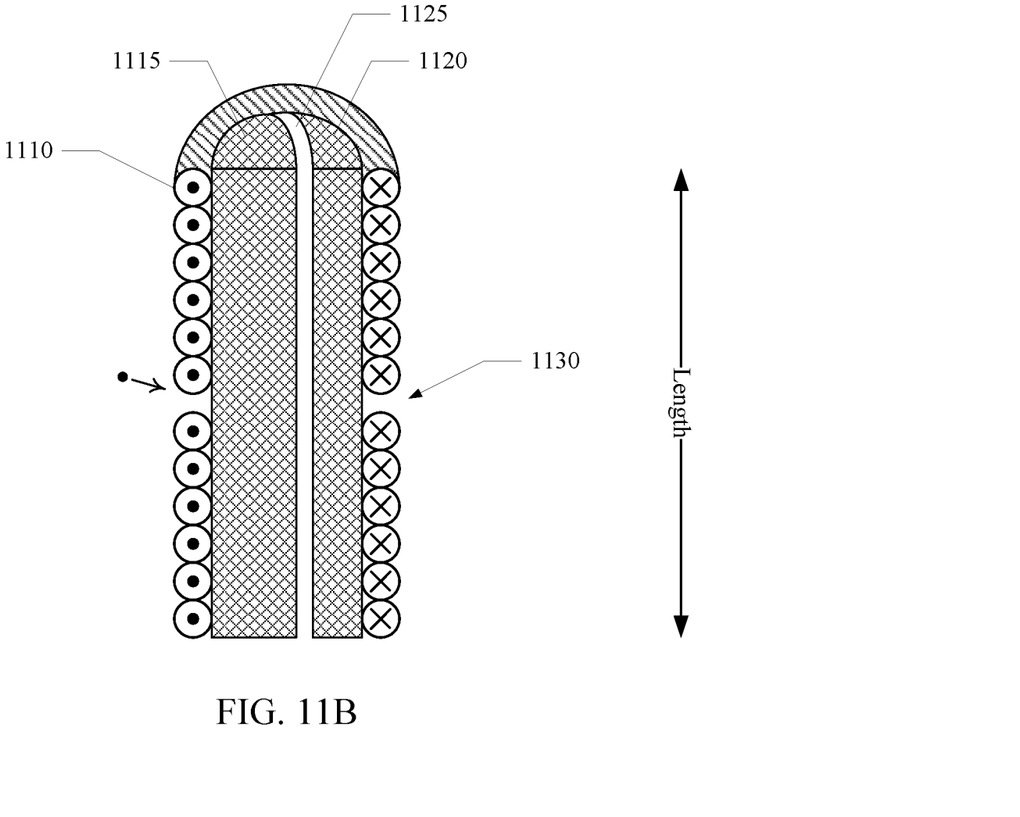

Referring now to FIGS. 11A and 11B, an exemplary device for applying a concentrated magnetic field to a charged particle, in accordance with another implementation of the present technology is shown. An end view of the device 1100 is illustrated in FIG. 1A, and a cutaway, along section line A-A, side view of the device 1100 is illustrated in FIG. 1B. The device 1100 can include one or more coils 1110 disposed about a length of a volume. The device 1100 can further include a plurality of foil, tape and/or bulk superconductor structures 1115, 1120 disposed in the interior volume of the coil 1110. A magnetic field carrying region 1125 can extend lengthwise and widthwise through the volume between at least two of the plurality of foil, tape and/or bulk superconductor structures 1115, 1120. One or more coil apertures 1130 can be disposed through the one or more coils 1110. The one or more coil apertures 1130 can be aligned to the widthwise ends of the magnetic field carrying region 1125.

The one or more coils 1110 can be configured to generate one or more magnetic fields in response to a current passing through the one or more coils 1110. The one or more coils 1110 can be arranged as a single helix, a double-helix, double racetrack, cosine theta, canted cosine-theta or the like. Although the one or more coils 1110 are illustrated as a cylinder, the one or more conductive coils 1110 can have any form factor. The one or more coils 1110 can be comprised of a resistive conductor or a superconductor. In one implementation, the one or more coils 1110 can comprise a split coil having a gap disposed between a first and second portion of the split coil. The gap of the split coil can comprise the one or more coil apertures 1130.

The plurality of foil, tape and/or bulk superconductor structures 1115, 1120 can be formed from a medium-temperature superconductor material or high-temperature superconductor material. In one implementation, the plurality of foil, tape and/or bulk superconductor 1115, 1120 can be arranged to fill the interior volume of the one or more coils 1110, and to form a magnetic field carrying region 1125. In one implementation, the plurality of bulk superconductor structures 1115, 1120 can be machined to fill the interior volume of the one or more coils 1110, and to form a curved magnetic field carrying region 1125 between first and second ones of the bulk superconductor structures 1115, 1120. In another implementation, the bulk superconductor material can be molded to form the plurality of bulk superconductor structures 1115, 1120 to fill the interior volume of the one or more coils 1110 and form the magnetic field carrying region 1125 disposed between first and second ones of the bulk superconductor structures 1115, 1120. In one implementation, the magnetic field carrying region 1125 can be an open space filled with atmospheric gases or select gases, at a select temperature range and/or pressure range, or be at a low vacuum pressure. In other implementations, the magnetic field carrying region 1125 can be partially or wholly filled by a mechanical reinforcement, such as a glass fiber reinforced epoxy resin to fix the position of the foil, tape and/or bulk superconductor structures 1115, 1120 and maintain a specified cross-sectional area of the magnetic field carrying region 1125. In addition, magnetic materials, including but not limited to paramagnetic, ferromagnetic, holmium and the like materials can be utilized in combination with the foil, tape and/or bulk superconductor structures 1115, 1120. The additional magnetic materials can be disposed as liners in the magnetic field carrying region along the foil, tape and/or bulk superconductor structures 1115, 1120, outside the foil, tape and/or bulk superconductor structures 1115, 1120 proximate the entry and/or exit to the magnetic field carrying region 1125, and/or the like. The additional magnetic materials can for example be utilized to improve or modify the magnetic flux distribution in the magnetic field carrying region 1125, the discontinuity in the magnetic field at the entry and/or exit to the magnetic field carrying region 1125, and/or the like.

The one or more magnetic fields generated by the one or more conductive coils 1110 are partially or wholly excluded from within the one or more foil, tape and/or bulk superconductor structures 1115, 1120 by the superconductor material, thereby compressing or guiding the one or more magnetic fields through the magnetic field carrying region 1125 disposed lengthwise through the one or more conductive coils. Compressing or guiding the one or more magnetic fields generated by the one or more conductive coils 1110 advantageously increases the magnetic flux density within the magnetic field carrying region 1125.

The one or more coil apertures 1130 can be configured to allow charged particles 1135 to pass through the one or more coils 1110 and enter the magnetic field carrying region 1125. Likewise, the one or more coil apertures 1130 can be configured to allow the charged particles 1135 to exit through the one or more coils 1110 after passing through the magnetic field carrying region 1125. As the charged particles 1135 pass through the magnetic field carrying region 1125, perpendicular to the compressed magnetic field, the compressed magnetic field deflects the charged particles 1135 in a semicircular arc, arcuate, semicircular, compound arc or the like path.

The magnetic field carrying region 1125 can has any uniform or non-uniform shape. For example, the magnetic field carrying region 1125 may differ along the length of the coil, may differ in across the coil, and/or the like. In one implementation, the geometry of the magnetic field carrying region 1125 can be based on a specified energy range for the charged particles passing through the magnetic field carrying region 1125, a specified magnetic flux range of the compressed magnetic field, and a specified bending radius range for the charged particles. In one implementation, the magnetic field carrying region 1125 can be substantially straight through the interior of the one or more coils 1110 with a given width to account for the bending radius of the charged particles and various tolerances and deviations. In another implementation, the magnetic field carrying region 1125 can have a curve substantially equal to the specified bending radius for the charged particles, and therefore the width of the magnetic field carrying region 1125 can be reduced as compared to a straight magnetic field carrying region 1125 profile.

Figure 12:
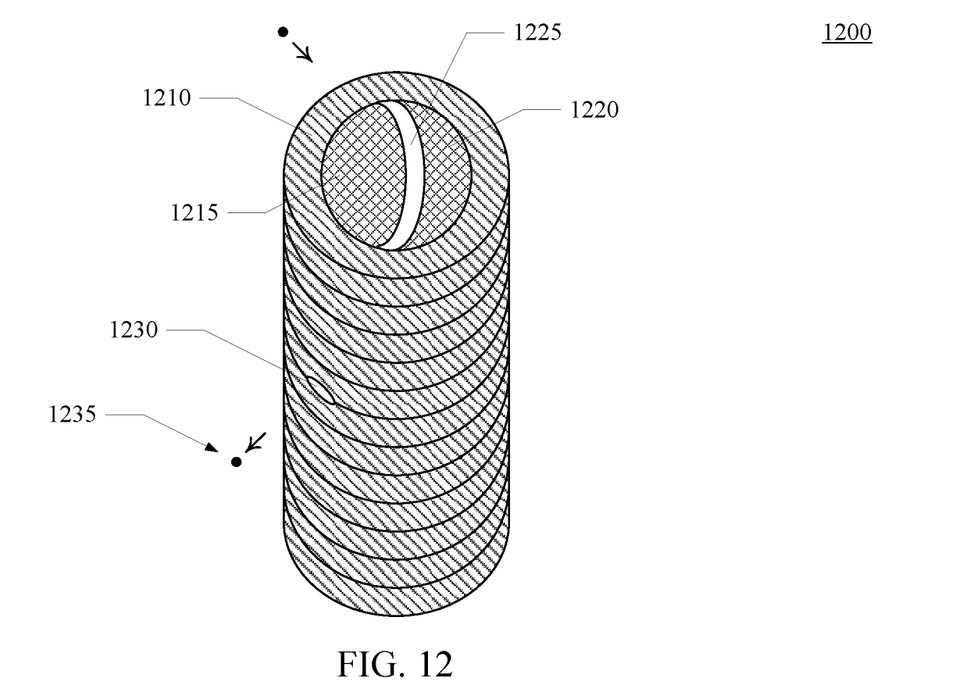
FIG. 12 shows an exemplary device for applying a concentrated magnetic field to a charged particle, in accordance with another implementation of the present technology.

Referring now to FIG. 12, an exemplary device for applying a concentrated magnetic field to a charged particle, in accordance with another implementation of the present technology, is shown. The device 1200 is substantially similar to the device described above with reference to FIG. 11. Again, the one or more coils 1210 can be a single helix, a double-helix, double racetrack, cosine theta, canted cosine-theta or the like. However, the one or more coils 1210 can include one or more localized "wiggles" in the windings configured to form the one or more one or more coil apertures 1230 aligned to the widthwise ends of the magnetic field carrying region 1225.

Again, the one or more coil apertures 1230 can be configured to allow charged particles 1235 to pass through the one or more coils 1210 and enter the magnetic field carrying region 1225 disposed between the foil, tape and/or bulk superconductor structures 1215, 1220. Likewise, the one or more coil apertures 1230 can be configured to allow the charged particles 1235 to exit through the one or more coils 1210 after passing through the magnetic field carrying region 1225. As the charged particles 1235 pass through the magnetic field carrying region 1225, perpendicular to the compressed magnetic field, the compressed magnetic field deflects the charged particles 1235 in a semicircular arc, arcuate, semicircular, compound arc or the like path.

Figure 13:
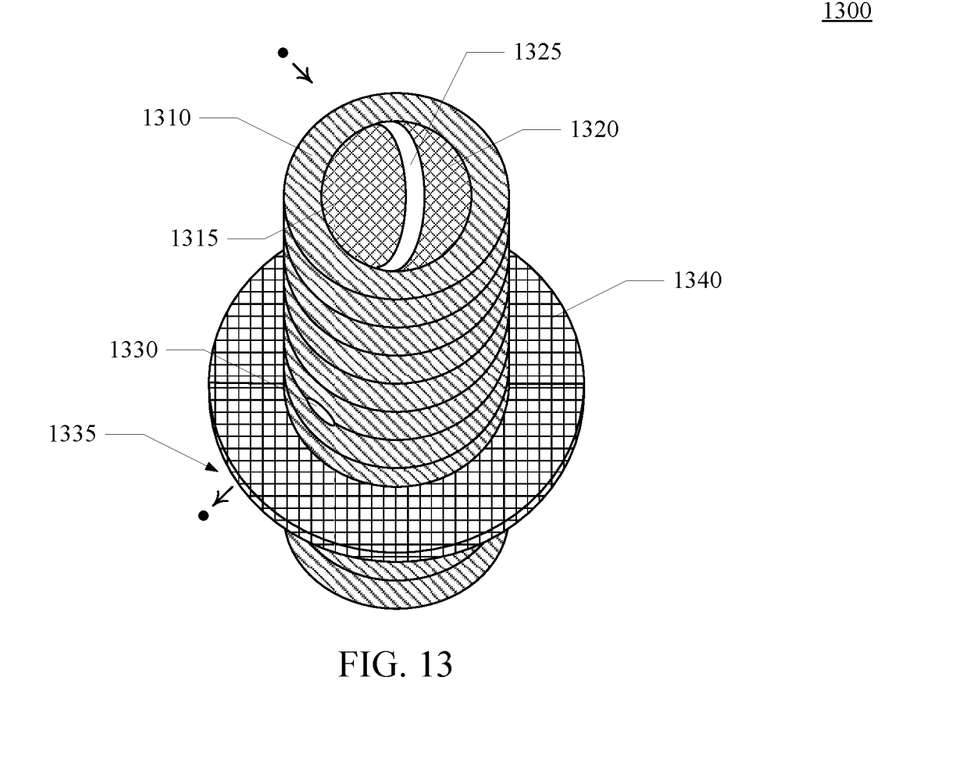
FIG. 13 shows an exemplary device for applying a concentrated magnetic field to a charged particle, in accordance with another implementation of the present technology.

Referring now to FIG. 13, an exemplary device for applying a concentrated magnetic field to a charged particle, in accordance with another implementation of the present technology, is shown. The device 1300 is substantially similar to the device described above with reference to FIG. 12. The device 1300 further includes one or more magnetic shield structures 1340 disposed about the one or more conductive coils 1310. The one or more magnetic shield structures 1340, for example, can comprise a bulk superconductor shield material. The one or more magnetic shield structures 1340 can have any form factor configured to disperse or reduce one or more magnetic fields proximate the device 1300. For example, the one or more magnetic shield structures 1340 can have a form factor that is disposed about the outside of the one or more conductive coils 1310 and extends along the length of the one or more conductive coils 1310, as illustrated in FIGS. 1A and 1B. In another example, the one or more magnetic shield structures 1340 can have a form factor that is disposed about the outside of the one or more conductive coils 1310 and extends radially out from the one or more conductive coils 1310, as illustrated in FIG. 13.

Again, the one or more coil apertures 1330 can be configured to allow charged particles 1335 to pass through the one or more coils 1310 and enter the magnetic field carrying region 1325 disposed between the bulk superconductor structures 1315, 1320. Likewise, the one or more coil apertures 1330 can be configured to allow the charged particles 1335 to exit through the one or more coils 1310 after passing through the magnetic field carrying region 1325. As the charged particles 1335 pass through the magnetic field carrying region 1325, perpendicular to the compressed magnetic field, the compressed magnetic field deflects the charged particles 1335 in a semicircular arc, arcuate, semicircular, compound arc or the like path.

Figure 14:
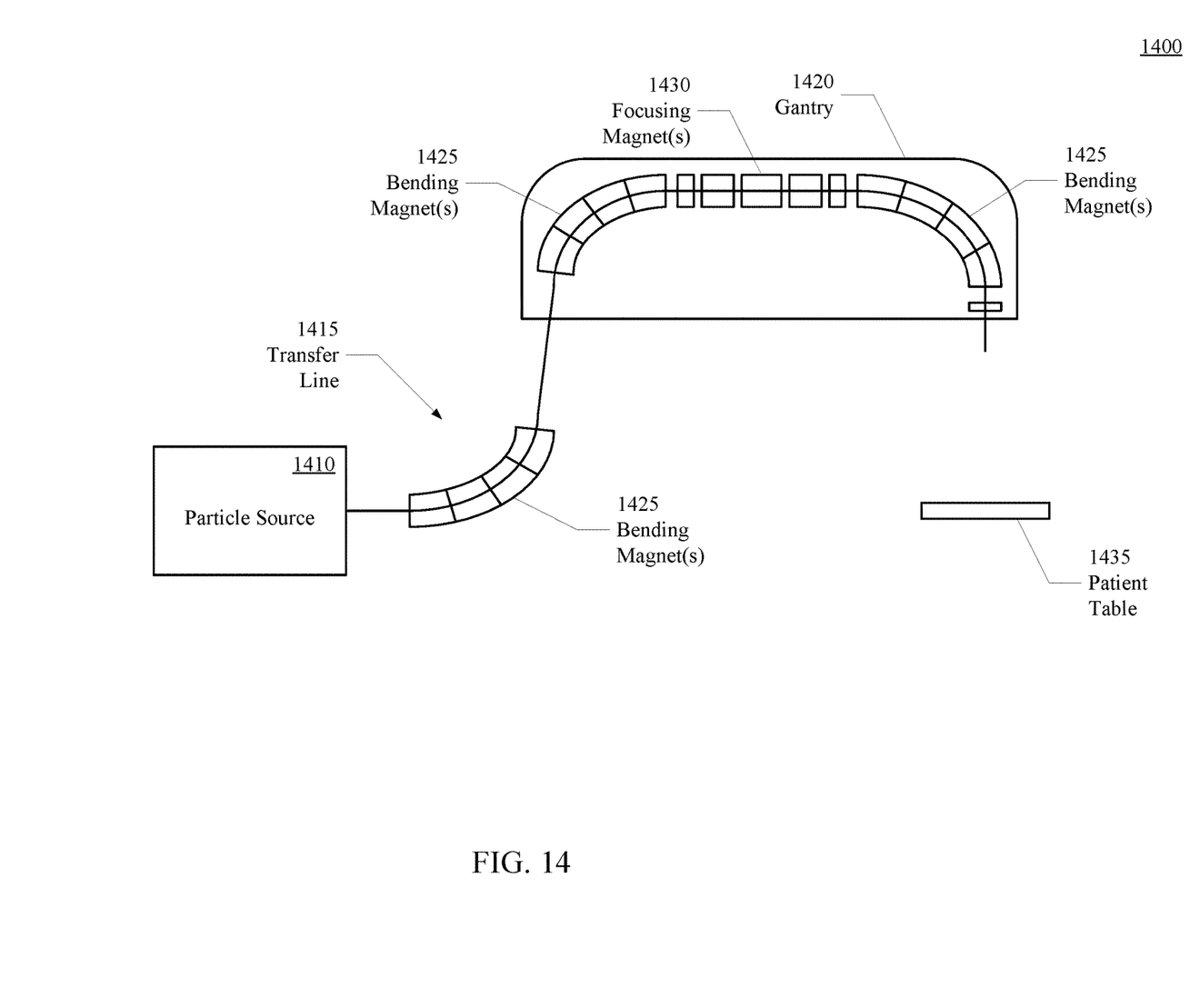
FIG. 14 shows an exemplary particle therapy system that includes one or more devices for concentrating one or more magnetic fields, in accordance with aspects of the present technology.

Referring now to FIG. 14, an exemplary particle therapy system including one or more devices for concentrating one or more magnetic fields, in accordance with aspects of the present technology, is shown. The particle therapy system 1400 can include a particle source 1410, a transfer line 1415, a gantry 1420, a plurality of bending magnets 1425, a plurality of focusing magnets 1430, and a patient table 1435. The particle therapy system 1400 typically also includes numerous other components, such as beam scanning components, beam instrumentation components, vacuum components, power supply components, cooling components, mechanical support components, gantry drive components and the like, that are not necessary for an understanding of aspects of the present technology and therefore are not described further herein.

In one implementation, the particle source 1410 can be a cyclotron configured to generate a stream of protons on the transfer line 1415. The gantry 1420 can be configured to rotate around the patient table 1435 to provide the charged particles to a target area, such a cancer or tumor in a patient. By rotating the gantry 1420 around the patient on the patient table 1435 a given dose can be delivered to the target area while reducing the dose delivered to surrounding tissue. Commonly the gantry 1420 can be configured to rotate by ±180° about the patient table 1435.

The plurality of bending magnets 1425 are configured to direct the charged particle stream along the transfer line 1415 under a defined angle to the patient table 1435. The plurality of focusing magnets can be configured to focus the charged particle stream as it propagates along the transfer line 1415 to compensate for various distortion along the transfer line 1415.

In one implementation, one or more of the bending magnets 1425 can be configured to apply a concentrated magnetic field to a charged particle in accordance with aspects of the present technology. For example, one or more of the bending magnets can comprise a solenoid configured to generate a dipole magnetic field. The one or more bending magnets can further include a bulk superconductor structure disposed within the solenoid. The bulk superconductor structure can include a slot extending lengthwise and widthwise within the solenoid that is configured to concentrate dipole magnetic field generated by the solenoid in the curved channel. The solenoid can include apertures aligned at the widthwise ends of curved channel for the proton beam to pass through the curved channel. The concentrated dipole magnetic field in the channel acts to bend the trajectory of the proton particle beam. In an exemplary implementation, the one or more bending magnets can be as described above with reference to FIGS. 11A and 11B, 12, and/or 13, or a plurality of one or more of such bending magnets to implement a compound bending magnet.

Alternatively or in addition, one or more of the focusing magnets 1430 can be configured to apply a concentrated magnetic field in accordance with aspects of the present technology. For example, one or more of the focusing magnets can comprise four solenoids configured to generate a quadrupole magnetic field. The one or more focusing magnets can further include bulk superconductor structures disposed in each solenoid, wherein the bulk superconductor structures are configured to concentrate the quadrupole, sextupole or the like magnetic field. In an exemplary implementation, the one or more focusing magnets can be a quadrupole magnet, as described above with reference to FIG. 7 and configured to focus a charged particle stream.

In addition, the use of one or more superconducting shield structures, as described above with reference to FIGS. 1A and 1B, 2A and 2B, and/or 13 about the one or more bending magnets 1425 and/or one or more focusing magnets 1430 can reduce, or even fully remove, undesirable stray magnetic fields around the magnets. This can enable placement of bending magnets 1425 and/or focusing magnets 1430 closer to gantry front-end components such as imaging and scanner components. Likewise, this can enable placement of bending magnets 1425 and/or focusing magnets 1430 closer to the patient, which is important for compact gantries.

The concentrated magnetic fields provided by the foil, tape and/or bulk superconductor structures can advantageously reduce the weight and/or size of one or more bending magnets 1425, one or more focusing magnets 1430, and/or the like. The reduced weight and/or size can also lead to a reduction in the cost of the one or more bending magnets 1425, one or more focusing magnets 1430, and/or the like. The reduced weight and/or size of the one or more bending magnets 1425, one or more focusing magnets 1430, and/or the like can also lead to a reduction in the size and/or weight of the gantry 1420. In addition, the concentrated magnetic fields provided by the foil, tape and/or bulk superconductor structures can advantageously reduce the current needed to generate a given magnetic flux and/or the cooling needed for operating the one or more bending magnets 1425, one or more focusing magnets 1430, and/or the like. The reduced current and/or cooling can lead to a further reduction in the weight and/or size of the gantry 1420. The reduced current and/or cooling requirements can also lead to a reduction in the cost of the power supply, cooling components, and/or the like. Furthermore, the reduced size and/or weight of the gantry 1420 can lead to a reduction in the cost of the gantry support structure.

The following examples pertain to specific technology embodiments and point out specific features, elements, or steps that may be used or otherwise combined in achieving such embodiments.

Example 1 includes a magnetic field concentrating or guiding device comprising: one or more coils to generate one or more magnetic fields; and one or more superconductor structures disposed in one or more predetermined positions with relation to the one or more coils and shaped to concentrate or guide the one or more magnetic fields.

Example 2 includes the magnetic field concentrating or guiding device according to Example 1, wherein the one or more superconductor structures comprise one or more bulk superconductor structures.

Example 3 include the magnetic field concentrating or guiding device according to Example 1, wherein the one or more superconductor structures comprise one or more foil or tape superconductor structures.

Example 4 includes magnetic field concentrating or guiding device according to Example 1, wherein the one or more superconductor structures comprise a combination of one or more bulk superconductor structures and one or more foil or tape superconductor structures.

Example 5 includes the magnetic field concentrating or guiding device according to any one of Examples 1-4, wherein the one or more superconductor structures comprise one or more high-temperature superconductor structures.

Example 6 includes the magnetic field concentrating or guiding device according to any one of Examples 1-4, wherein the one or more coils comprise a plurality of coils disposed to generate a plurality of magnetic fields at predetermined orientations.

Example 7 includes the magnetic field concentrating or guiding device according to any one of Examples 1-4, wherein the one or more superconductor structures form one or more channels lengthwise through the one or more coils.

Example 8 includes the magnetic field concentrating or guiding device according to Example 7, wherein a geometry of the one or more channels is configured to shape the one or more magnetic fields.

Example 9 includes the magnetic field concentrating or guiding device according to any one of Examples 1-4, further comprising: a superconductor shield structure disposed about the one or more coils.

Example 10 includes a magnetic field concentrating or guiding device comprising: one or more conductive coils disposed about a length of a volume; one or more structures disposed in the volume, wherein the one or more structures include a foil, tape or bulk superconductor; a magnetic field carrying region extending lengthwise through the volume; and one or more apertures disposed through the one or more conductive coils and the magnetic field carrying region.

Example 11 includes the magnetic field concentrating or guiding device according to Example 10, wherein the one or more apertures disposed through the magnetic field carrying region includes the magnetic field carrying region extending widthwise through the volume.

Example 12 includes the magnetic field concentrating or guiding device according to Example 10, wherein: the magnetic field carrying region further extends widthwise through the volume; and the one or more apertures are further disposed through the one or more conductive coils to widthwise ends of the magnetic field carrying region.

Example 13 includes the magnetic field concentrating or guiding device according to Example 10, further comprising: a superconductor shield disposed about the one or more conductive coils.

Example 14 includes the magnetic field concentrating or guiding device according to Example 13, wherein the one or more apertures are further disposed through the superconductor shield.

Example 15 includes the magnetic field concentrating or guiding device according to any one of Examples 10-14, wherein a geometry of the magnetic field carrying region is a function of a specified energy range for a charged particle beam passing widthwise through the magnetic field carrying region, a specified magnetic flux range for passing lengthwise through the magnetic field carrying region, and a specified bending radius range for the charged particle beam.

Example 16 includes the magnetic field concentrating or guiding device according to any one of Examples 10-14, further comprising one or more coolers coupled to the plurality of foil, tape or bulk superconductor structures.

Example 17 includes a magnetic field concentrating or guiding method comprising: providing a coil; and providing a superconductor having a channel disposed in a predetermined position with relation to the coil.

Example 18 includes the magnetic field concentrating or guiding method of Example 17, wherein the channel extends lengthwise and widthwise through an interior volume of the coil.

Example 19 includes the magnetic field concentrating or guiding method of Example 17, wherein providing the superconductor comprises providing a high temperature superconductor disposed inside the coil.

Example 20 includes the magnetic field concentrating or guiding method of Example 19, further comprising cooling the superconductor below a critical temperature of the superconductor.

Example 21 includes the magnetic field concentrating or guiding method of any one of Examples 17-19, wherein providing the coil comprises providing a current passing through a resistive or superconducting coil.

Example 22 includes the magnetic field concentrating or guiding method of Example 21, further comprising cooling the superconducting coil below a critical temperature of the superconducting coil.

Example 23 includes a magnetic field concentrating or guiding method comprising: generating one or more magnetic fields; and concentrating or guiding the one or more magnetic fields.

Example 24 includes the magnetic field concentrating or guiding method of Example 23, wherein generating the one or more magnetic fields comprises passing a current in a helix path around a length of a volume.

Example 25 includes the magnetic field concentrating or guiding method of Example 24, wherein concentrating or guiding the one or more magnetic fields comprises confining the one or more magnetic fields to a contiguous portion of the volume, wherein the contiguous portion extends the length of the volume.

Example 26 includes the magnetic field concentrating or guiding method of Examples 23 or 24, further comprising: passing a charged particle beam through the concentrated or guided one or more magnetic fields.

Example 27 include the magnetic field concentrating or guiding method of Examples 23 or 24, wherein the one or more magnetic fields comprise a plurality of magnetic fields disposed at predetermined orientations to each other.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A device comprising:
   a conductor disposed in a coil; and
   one or more superconductor regions disposed in the coil;
   a magnetic field carrying region disposed through the superconductor regions; and
   an aperture passing through the coil and aligned to widthwise ends of the magnetic field carrying region.

2. The device of claim 1, further comprising a shield disposed about the coil.

3. The device of claim 2, wherein the shield comprises a superconductor.

4. The device of claim 1, wherein the one or more superconductor regions comprise a rare-earth barium copper oxides (REBCO), yttrium barium copper oxide (YBCO), gadolinium barium copper oxide (GdBCO), europium barium copper oxide (EUBCO), lanthanum barium copper oxide (LBCO), bismuth strontium calcium copper oxide (BSCCO), magnesium diboride (MgB2), iron (Fe) or pnictides based superconductor.

5. The device of claim 1, wherein a geometry of the magnetic field carrying region is configured to concentrate a magnetic field generated by the coil.

6. The device of claim 1, wherein the geometry of the magnetic field carrying region comprise a curve widthwise.

7. The device of claim 1, wherein:
   wherein the one or more superconductor regions are configured to concentrate a magnetic field generated by the coil in the magnetic field carrying region; and
   the aperture is configured to allow charged particles to pass through the coil and the concentrated magnetic field in the magnetic field carrying region.

8. The device of claim 7, wherein the concentrated magnetic field in the magnetic field carrying region is configured to deflect the charged particles passing through the magnetic field carrying region.

9. The device of claim 1, wherein the coil is arranged in a single helix winding, plurality of concentric helix windings, one or more canted helix windings or one or more cosine-theta windings.

10. A device comprising:
    a superconductor having a channel extending lengthwise through the superconductor;
    a coil disposed about the superconductor; and
    an aperture disposed through the coil and across a width of the channel.

11. The method of claim 10, wherein:
    a current passing through the coil generates a magnetic field that is concentrated in the channel extending lengthwise through the superconductor; and
    a charged particle passing through the aperture and the concentrated magnetic field is deflected by the concentrated magnetic field in the channel.

12. The method of claim 10, wherein the superconductor comprises a bulk high temperature superconductor.

13. The method of claim 12, wherein the bulk high temperature superconductor is cooled below the critical temperature of the bulk high temperature superconductor.

14. The method of Clam 10, wherein the coil comprises a superconductor coil.

15. The method of claim 14, wherein the superconductor coil is cooled below the critical temperature of the superconductor coil.

16. The method of claim 10, further comprising a shield disposed about an outside of the coil.

17. The method of claim 16, wherein the shield comprises a superconductor.

18. The method of claim 10, wherein the coil is arranged in a single helix winding, plurality of concentric helix windings, one or more canted helix windings or one or more cosine-theta windings.

19. The method of claim 10, wherein the superconductor comprises a rare-earth barium copper oxides (REBCO), yttrium barium copper oxide (YBCO), gadolinium barium copper oxide (GdBCO), europium barium copper oxide (EUBCO), lanthanum barium copper oxide (LBCO), bismuth strontium calcium copper oxide (BSCCO), magnesium diboride (MgB2), iron (Fe) or pnictides based superconductor.

* * * * *